United States Patent
Kim

(10) Patent No.: US 6,649,964 B2
(45) Date of Patent: Nov. 18, 2003

(54) BODY-TO-SUBSTRATE CONTACT STRUCTURE FOR SOI DEVICE AND METHOD FOR FABRICATING SAME

(75) Inventor: Young-Hoon Kim, Cheongju (KR)

(73) Assignee: Hynix Semiconductor, Inc., Kyoungki-Do (KR)

( * ) Notice: Subject to any disclaimer, the term of this patent is extended or adjusted under 35 U.S.C. 154(b) by 39 days.

(21) Appl. No.: 09/860,635

(22) Filed: May 21, 2001

(65) Prior Publication Data

US 2002/0037607 A1 Mar. 28, 2002

(30) Foreign Application Priority Data

Sep. 22, 2000 (KR) .................................... 2000-55803

(51) Int. Cl.⁷ .............................................. H01L 27/08
(52) U.S. Cl. ........................ 257/308; 257/307; 257/309
(58) Field of Search ............................. 257/308, 309, 257/307, 303, 311, 304; 438/254, 255, 253, 397, 398, 238

(56) References Cited

U.S. PATENT DOCUMENTS

| 5,340,754 A | * | 8/1994 | Witek et al. | 438/156 |
|---|---|---|---|---|
| 5,581,101 A | * | 12/1996 | Ning et al. | 257/347 |
| 5,744,386 A | * | 4/1998 | Kenney | 438/242 |
| 5,795,810 A | * | 8/1998 | Houston | 438/404 |
| 6,013,936 A | * | 1/2000 | Colt, Jr. | 257/345 |
| 6,027,967 A | * | 2/2000 | Parekh et al. | 438/254 |
| 6,121,658 A | * | 9/2000 | Houston | 257/347 |
| 6,235,567 B1 | * | 5/2001 | Huang | 438/202 |
| 6,284,593 B1 | * | 9/2001 | Mandelman et al. | 438/243 |
| 6,288,427 B2 | * | 9/2001 | Huang | 257/350 |
| 6,303,434 B1 | * | 10/2001 | Parekh et al. | 438/254 |
| 6,331,720 B1 | * | 12/2001 | Parekh et al. | 257/308 |

* cited by examiner

Primary Examiner—Carl Whitehead, Jr.
Assistant Examiner—Laura M Schillinger
(74) Attorney, Agent, or Firm—Birch, Stewart, Kolasch & Birch, LLP

(57) ABSTRACT

The semiconductor substrate body-substrate contact structure for a SOI device includes an SOI substrate having a semiconductor substrate, a buried insulating film formed on an upper surface of the semiconductor substrate, and a semiconductor body layer formed on an upper surface of the buried insulating film. The SOI substrate includes a trench exposing an upper surface of the semiconductor substrate, and semiconductive side wall spacers are formed on side walls of the trench. A device isolation insulating film is formed in the trench.

5 Claims, 4 Drawing Sheets

BODY-TO-SUBSTRATE CONTACT STRUCTURE FOR SOI DEVICE AND METHOD FOR FABRICATING SAME

BACKGROUND OF THE INVENTION

1. Field of the Invention

The present invention relates to a method for fabricating a semiconductor device, and more particularly, to a body-to-substrate contact structure for a silicon on insulator (SOI) semiconductor device and method for fabricating the same.

2. Description of the Background Art

FIG. 1 is a cross sectional view illustrating a structure of a conventional SOI metal oxide semiconductor field effect transistor (MOSFET).

First, an SOI substrate 100 is prepared. The SOI substrate 100 includes a silicon bulk substrate 101, a buried oxide film 102 formed on the upper surface of the silicon bulk substrate 101, and a semiconductor body layer 103 formed on the upper surface of the buried oxide film 102. The semiconductor body layer 103 is a semiconductor layer on which a source/drain of the MOSFET is to be formed. The semiconductor body layer 103 and the buried oxide film 102 are partially etched and removed, and a device isolation insulating film 104 is formed in the resulting trench between each semiconductor body layer 103 and a neighboring semiconductor body layer 103.

The semiconductor body layer 103 is doped with p-type or n-type impurities. A n-channel MOSFET (NT) is formed at a p-type semiconductor body doped with p-type impurities, and a p-channel MOSFET (PT) is formed at a n-type semiconductor body doped with n-type impurities.

A gate oxide film 105 and a gate electrode 106 are sequentially stacked on the upper surface of the semiconductor body layer 103, and a source/drain 107 is formed on the semiconductor body layer 103 at both sides of the gate electrode 106.

An interlayer insulating film 108 is formed on the entire upper surface of the gate electrode 106, semiconductor body layer 103, and device isolation insulating film 104. Contact holes 109 formed by selectively etching the interlayer insulating film are formed respectively on an upper portion of the source/drain 107 and the gate electrode 106. Metal wires 110, e.g., conductive paths for applying a predetermined voltage to the gate electrode 106 and the source/drain 107, are formed in the contact holes. Meanwhile, a ground power supply, a fixed voltage, is connected to the lower surface of the semiconductor substrate 100.

The SOI device of FIG. 1 has various advantages as compared to the semiconductor device fabricated on the silicon bulk substrate. Because a source/drain capacitance is reduced, the SOI device performs a high speed circuit operation well, has a high reliability of isolation between devices, and has a strong resistance to a soft error due to alpha particles. However, it has the following disadvantage. As illustrated in FIG. 1, the silicon bulk substrate at the lower portion of the buried oxide film is connected to the ground voltage to thus maintain a fixed voltage, while the semiconductor body layer 103 is not connected to a fixed voltage and isolated from the silicon bulk substrate. Therefore, the potential of the semiconductor body 103 varies according to the variation of voltage applied to the source/drain. As a result, a floating body effect which makes the function of the device unstable occurs. Examples of the floating body effect include a kink effect and a parasitic bipolar effect.

In other words, if a high voltage is applied to the drain, a high electric field occurs, which causes an impact ionization for thereby generating electron-hole pairs around the drain. The holes of the generated electron-hole pairs are injected into the semiconductor body layer and positively charge the semiconductor body layer. If the semiconductor body is positively charged, the potential of the body layer increases and causes variation of the threshold voltage. Accordingly, a kink is shown on a drain current (Id)—voltage (Vd) curve.

In addition, as the potential of the semionductor body layer increases, a source-body junction, e.g., an emitter-base junction, becomes more forwardly biased; thus injecting eletrons from the source toward the body layer. The electrons injected into the body layer increase drain current by reaching a drain depletion region. Thus, a parasitic bipolar effect occurs which disables the control of drain-source current (Ids) by the gate electrode.

The most serious problem in fabricating a SOI device is the floating body effect. In order to disable the floating body effect, the semiconductor body layer must be connected to a fixed voltage. However, it is not easy to connect the semiconductor body layer to a fixed voltage source because the semiconductor substrate and the semiconductor body layer are isolated from each other by an insulating film formed therebetween.

SUMMARY OF THE INVENTION

Accordingly, it is an object of the present invention to provide a body-to-substrate contact structure for a SOI device and method for fabricating the same which is capable of suppressing a floating body effect.

It is another object of the present invention to provide a body-to-substrate contact structure for a SOI semiconductor device and method for fabricating the same which has a simple process and wherein the occupying area of the substrate is not increased since no wiring structure is added to a conventional SOI device.

It is another object of the present invention to provide a body-to-substrate contact structure for a SOI semiconductor device and method for fabricating the same which forms a body-to-substrate contact path by forming a semiconductive side wall spacer at a device isolation region.

To achieve these and other objects, there is provided a body-substrate contact structure for an SOI semiconductor device according to the present invention which includes: an SOI substrate having a semiconductor substrate base layer, a buried insulating film formed on an upper surface of the semiconductor substrate base layer, and a semiconductor body layer formed on an upper surface of the buried insulating film, the SOI substrate including a trench exposing an upper surface of the semiconductor substrate base layer; semiconductive side wall spacers formed on side walls of the trench; and a L device isolation insulating film formed in the trench.

To achieve the above and other objects, there is provided a method for fabricating a body-substrate contact structure for a SOI semiconductor device according to the present invention, which includes the steps of: forming a trench in an SOI substrate, the SOI substrate including a semiconductor substrate, a buried insulating film formed on an upper surface of the semiconductor substrate, and a semiconductor body layer formed on an upper surface of the buried insulating film, and the trench exposing the semiconductor substrate; forming semiconductive side wall spacers on side walls of the trench; and forming a device isolation insulating film in the trench.

BRIEF DESCRIPTION OF THE DRAWINGS

The present invention will become better understood with reference to the accompanying drawings that are given only by way of illustration and thus are not limitative of the present invention, wherein.

DETAILED DESCRIPTION OF THE PREFERRED EMBODIMENTS

Figure 1:
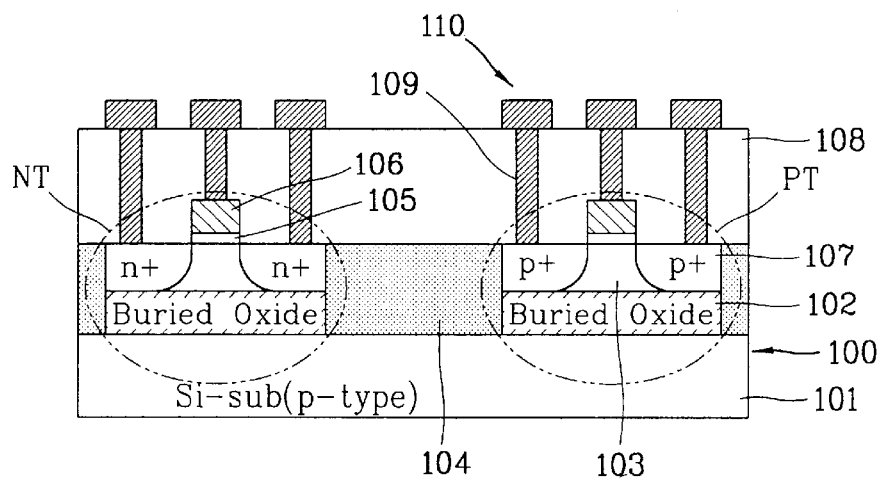
FIG. 1 is a vertical cross-sectional view illustrating the structure of a conventional SOI device.
Figure 2:
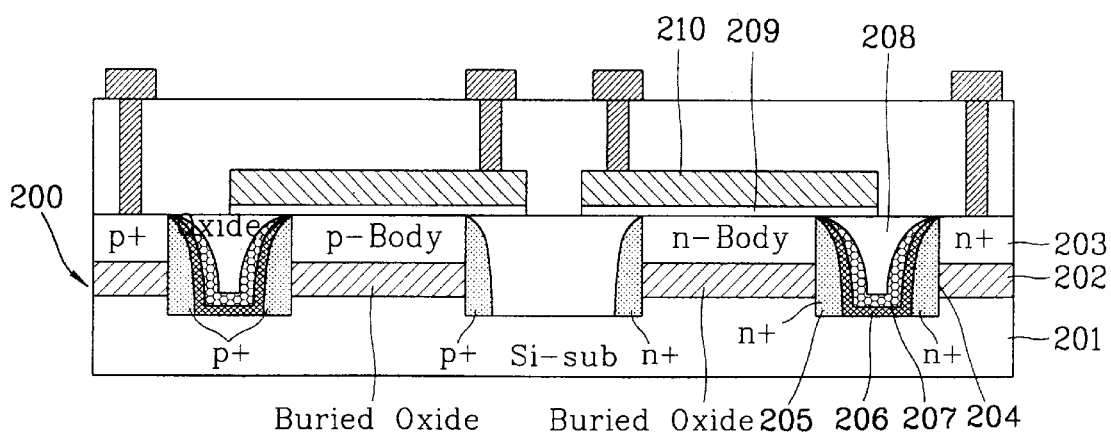
FIG. 2 is a vertical cross-sectional view illustrating a semiconductor body-to-substrate for a SOI device according to an embodiment of the present invention.

The preferred embodiment of the present invention will now be described with reference to FIG. 2.

First, as illustrated therein, a SOI substrate 200 is prepared, which includes a semiconductor substrate 201, e.g., a silicon bulk substrate 201, a buried insulating film 202 formed on the upper surface of the bulk substrate, and a semiconductor body layer 203 formed on the upper surface of the buried insulating film 202.

The semiconductor body layer 203 and the buried insulating film 202 are partially etched to thus form a trench 204 so that the upper surface of the bulk substrate 201 is exposed, and a semiconductive side wall spacer 205 is formed on side walls of the semiconductor body layer 203 and buried insulating film 202 in the trench 204. The semiconductive side wall spacer 205 is a path for connecting the semiconductor body layer 203 and the bulk substrate 201. The semiconductor body layer 203 is a region in which a source/drain of a transistor is to be formed. The semiconductive side wall spacer 205 is formed of doped polysilicon. It is preferred that the semiconductive side wall spacer 205 is formed of the same material as the semiconductor body layer 203.

A metallic barrier film 206 and a metallic film 207 are formed on the upper surface of the semiconductive side wall spacer 205. The metallic film 207 is preferably made of tungsten or titanium. The metallic film 207 is formed in order to lower the resistance of the semiconductive side wall spacer 205 which is a path for connecting the semiconductor body layer 203 and the silicon bulk substrate 201. As the resistance of the semiconductive side wall spacer 205 become smaller, charges accumulated on the semiconductor body layer 203 can be discharged to the semiconductor substrate 201 more rapidly, thus effectively suppressing a floating body effect. In addition, the metallic barrier film 206 is formed in order to prevent silicidization reaction between the metallic film 206 and the semiconductive side wall spacer 205, e.g., made of polylsilicon. If a silicidization reaction between the semiconductive side wall spacer 205 and the metallic film 207 occurs, the following problems occur. That is, in case of silicidization reaction, a silicide layer is formed as silicon is encroached. Thus, there is a possibility that the silicide layer is formed by encroaching even on the semiconductor layer 203 contacting with the side wall spacer 205 around the upper portion of the semiconductive side wall spacer 205. In this case, the source/drain of the MOSFET is short-circuited and disables normal operation of the MOSFET.

Therefore, in order to prevent the silicidization reaction, it is preferred that the metallic barrier film 206 is formed between the metallic film 207 and the semiconductive side wall spacer 205.

Reference numerals 208, 209, and 210 designate a device isolation insulating film, gate oxide film, and gate electrode, respectively.

Next, the method for fabricating a semiconductor body-to-substrate contact structure for an SOI structure according to an embodiment of the present invention will now be described with reference to FIGS. 3A through 3H.

Figure 3A:
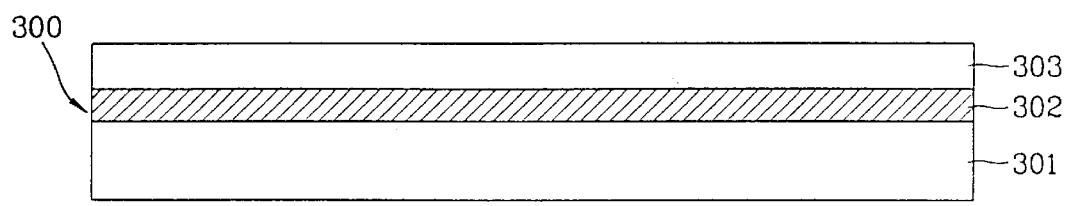
FIGS. 3A through 3I are process sequence views illustrating a sequence of a process for fabricating a semiconductor body-to-substrate contact structure for an SOI device according to one embodiment of the present invention.

First, as illustrated in FIG. 3A, an SOI substrate 300 is prepared, which includes a semiconductor substrate 301, a buried oxide film 302 formed on the upper surface of the semiconductor substrate 301, and a first semiconductor layer 303 formed on the upper surface of the buried oxide film 302.

The SOI substrate 300 can be fabricated by a conventionally well-known method.

Figure 3B:
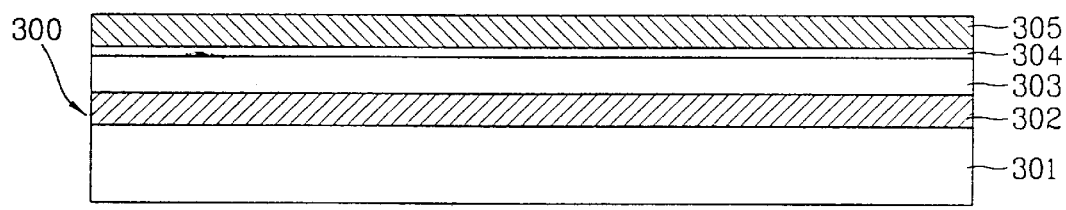

Next, as illustrated in FIG. 3B, a pad oxide film 304 is formed on the upper surface of the first semiconductor layer 303 of the SOI substrate 300 by thermal oxidation. Then, a silicon nitride film 305 is formed on the upper surface of the pad oxide film 304.

Figure 3C:
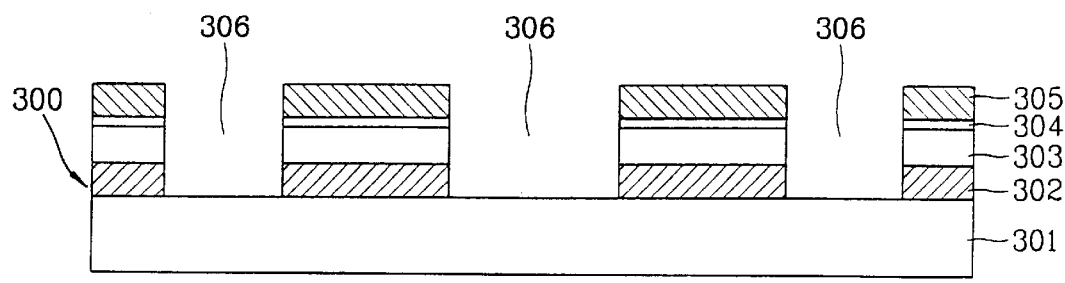

As illustrated in FIG. 3C, a trench 306 is formed by sequentially etching the silicon nitride film 305, pad oxide film 304, first semiconductor layer 303, and buried oxide film 302 by a selective etching method using a photoresist mask. This partially exposes the upper surface of the semiconductor substrate 301.

Figure 3D:
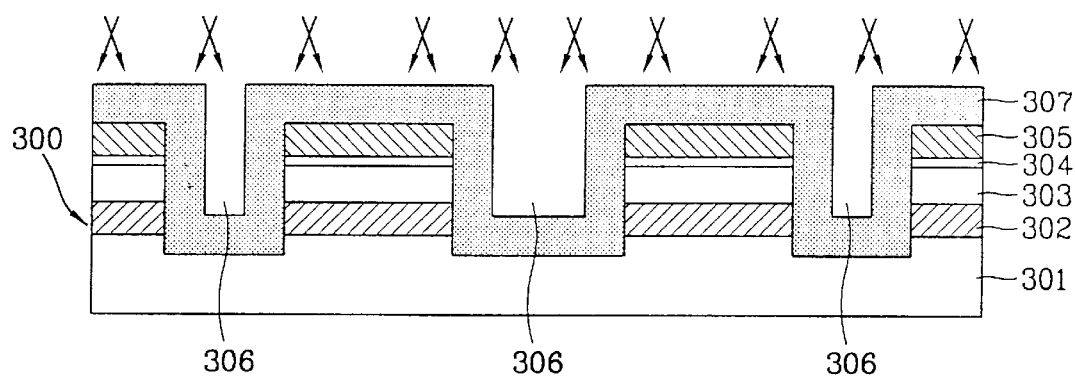

Next, as illustrated in FIG. 3D, a second semiconductor layer 307, such as a polysilicon layer or amorphous silicon layer, is formed on the front surface of the structure of FIG. 3C.

Then, n-type or p-type impurity ions are implanted into the second semiconductor layer 307. The impurity ions are electrically activated by performing rapid thermal treatment annealing of the SOI semiconductor substrate 300. Thus, if the second semiconductor layer is amorphous silicon, it is changed into polysilicon during the annealing process.

Figure 3E:
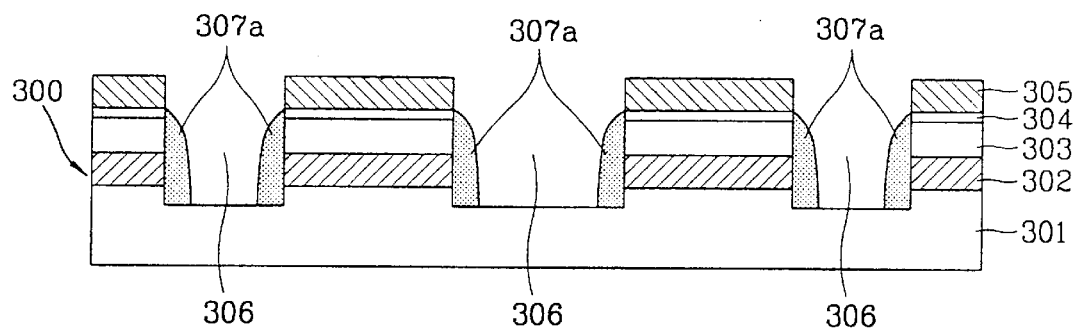

As illustrated in FIG. 3E, a side wall spacer 307a of the second semiconductor layer is formed on side walls of the first semiconductor layer 303 and buried oxide film 302 in the trench 306 by performing anisotropic etching of the second semiconductor layer 307 without an etching mask.

Figure 3F:
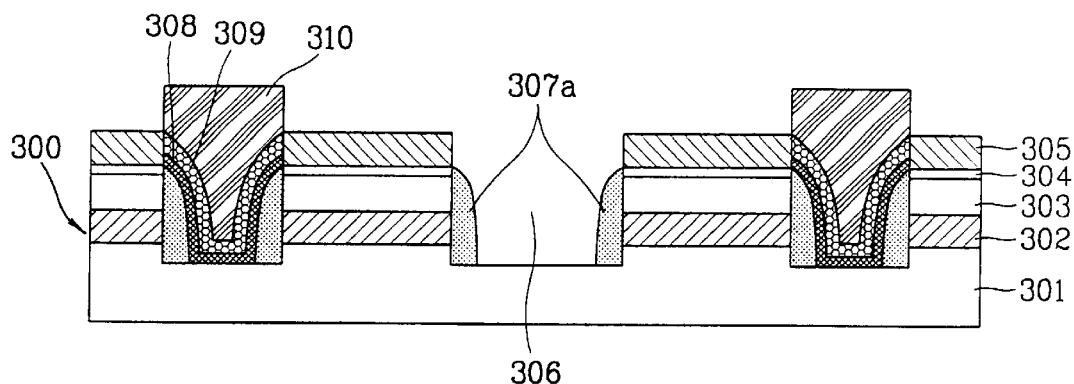

Next, as illustrated in FIG. 3F, a barrier metallic film 308 is formed on the upper surface of the structure of FIG. 3E. The barrier metallic film is formed of nitride tungsten or nitride titanium. Next, a metallic film 309 is formed oh the upper surface of the barrier metallic film 308. The metallic film is formed of tungsten or titanium.

Then, a photoresist pattern 310 is formed on the metallic film 309 in the trench 306. The barrier metallic film 308 and metallic film 309 on the upper surface of the silicon nitride film 305 are etched and removed by using the photoresist pattern as an etching mask. Resultantly, the metallic film 309 and the barrier metallic film 308 remain only in the trench 306. As shown in FIG. 3F, not all trenches 306 are masked by the photoresist 310; consequently, the barrier metallic film 308 and the metallic film 309 are removed from some trenches 306. As will be apparent from the following description, these trenches 306 will be used to form device isolation regions for electrically isolating MOSFET devices from each other.

Figure 3G:
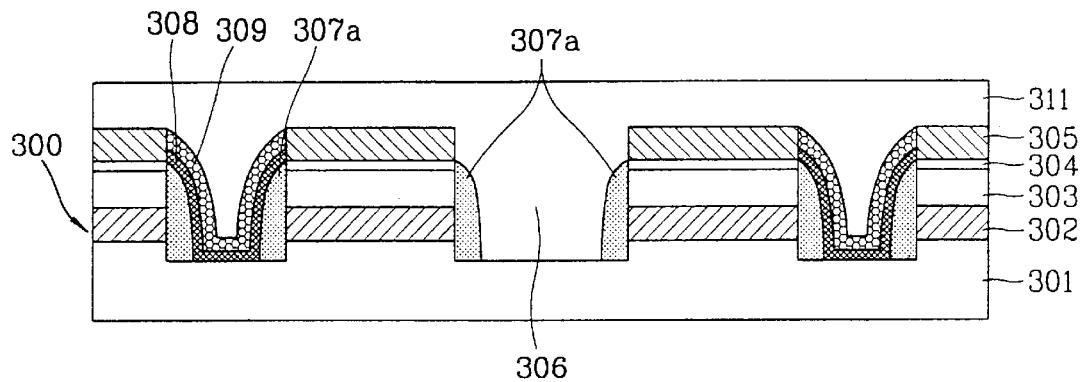

As illustrated in FIG. 3G, the photoresist pattern 310 is removed, and thereafter a silicon oxide film 311 is formed in the trench 306 and on the upper surface of the silicon nitride film 305 by chemical vapor deposition.

Figure 3H:
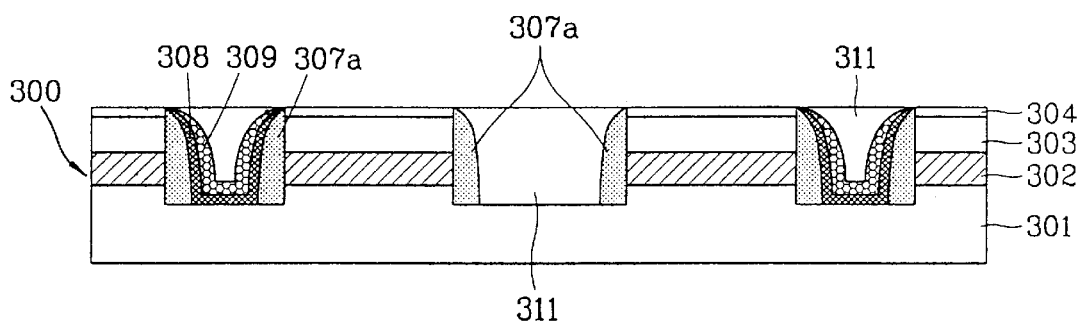

As illustrated in FIG. 3H, a chemical mechanical polishing process is carried out on the silicon oxide film 311 until the upper surface of the silicon nitride film 305 is exposed, thus leaving the silicon oxide film 311 only in the trench 306. The silicon oxide film 311 in the trench is a device isolation insulating film for electrically isolating MOSFET devices from each other.

Figure 3I:
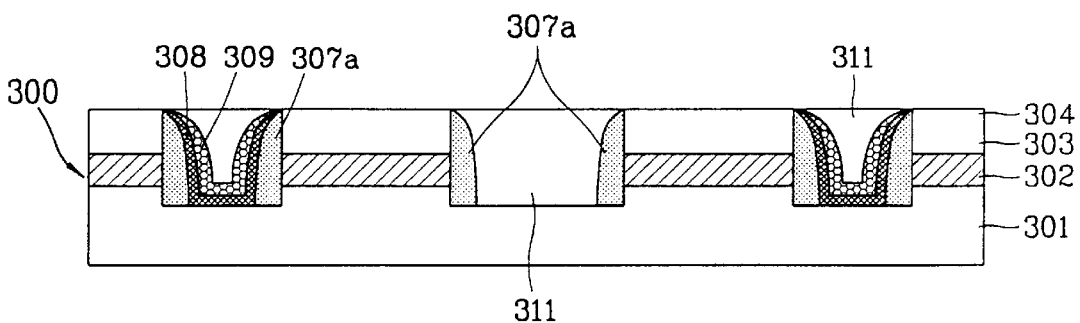

Next, as illustrated in FIG. 3I, the silicon nitride film 305 and the pad oxide film 304 are selectively removed. Resultantly, a semiconductor body-to-substrate connection structure for connecting the semiconductor body 303, e.g., the semiconductor layer 303 on which the source/drain of the transistor is to be formed, and the semiconductor substrate 301 by the side wall spacer 307a of the second semiconductor layer. Since a fixed voltage, such as a ground voltage, is connected to the lower surface of the bulk substrate 301, the semiconductor body 303 is connected to the fixed voltage. Consequently, the potential of the semiconductor body 303 is not varied according to the voltage applied to the source/drain formed at the semiconductor body 303. Thus makes it possible to maintain a stable voltage and accordingly suppress the generation of a floating body effect.

The present invention has an effect of suppressing a floating body effect of an SOI device by forming a semiconductive side wall spacer on side walls of the semiconductor body and electrically connecting the semiconductor body and the semiconductor substrate. In particular, since the semiconductor body-substrate contact structure of the present invention is formed by using a device isolation region, the occupying area of the substrate for body-to-substrate connection is unnecessary, thus not reducing the degree of integration of the SOI device. In addition, since no additional wiring line for the body-to-substrate connection structure is necessary, the fabrication and designing of the SOI device is easy.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A semiconductor substrate body-substrate contact structure for a SOI device, comprising:

a SOI substrate having a semiconductor substrate base layer;

a buried insulating film formed on an upper surface of the semiconductor substrate base layer;

a semiconductor body layer formed on an upper surface of the buried insulating film;

a trench exposing an upper surface of the semiconductor substrate base layer and extending through the semiconductor body layer and the buried insulating film;

semiconductive side wall spacers formed on side walls of the trench; and a device isolation insulating film formed in the trench.

2. The structure according to claim 1, wherein the semiconductive side wall spacers are made of polysilicon doped with impurities.

3. The structure according to claim 1, wherein a metallic film is additionally formed on an upper surface of the semiconductive side wall spacers.

4. The structure according to claim 3, wherein a barrier metallic film is formed between the semiconductive side wall spacers and the metallic film.

5. The structure according to claim 3, wherein the metallic film is a tungsten or titanium film.

* * * * *